(12) United States Patent  
Leobandung et al.

(10) Patent No.: US 10,916,468 B2  
(45) Date of Patent: Feb. 9, 2021

(54) SEMICONDUCTOR DEVICE WITH BURIED LOCAL INTERCONNECTS

(71) Applicant: ELPIS TECHNOLOGIES INC., Ottawa (CA)

(72) Inventors: Effendi Leobandung, Stormville, NY (US); Tenko Yamashita, Schenectady, NY (US)

(73) Assignee: ELPIS TECHNOLOGIES INC., Ottawa (CA)

( * ) Notice: Subject to any disclaimer, the term of this patent is extended or adjusted under 35 U.S.C. 154(b) by 953 days.

(21) Appl. No.: 15/442,822

(22) Filed: Feb. 27, 2017

(65) Prior Publication Data

US 2017/0170120 A1 Jun. 15, 2017

Related U.S. Application Data

(62) Division of application No. 14/548,648, filed on Nov. 20, 2014.

(51) Int. Cl.
| | |
|---|---|
| *H01L 21/74* | (2006.01) |
| *H01L 21/762* | (2006.01) |
| *H01L 29/66* | (2006.01) |
| *H01L 29/78* | (2006.01) |
| *H01L 29/417* | (2006.01) |
| *H01L 21/768* | (2006.01) |

(Continued)

(52) U.S. Cl.
CPC ...... *H01L 21/743* (2013.01); *H01L 21/76224* (2013.01); *H01L 21/76895* (2013.01); *H01L 21/76897* (2013.01); *H01L 21/823431* (2013.01); *H01L 23/535* (2013.01); *H01L 29/0649* (2013.01); *H01L 29/41791* (2013.01); *H01L 29/6656* (2013.01); *H01L 29/66545* (2013.01); *H01L 29/66553* (2013.01); *H01L 29/66795* (2013.01); *H01L 29/785* (2013.01); *H01L 29/7851* (2013.01); *H01L 29/6681* (2013.01); *H01L 29/66818* (2013.01); *H01L 2029/7858* (2013.01)

(58) Field of Classification Search
CPC ...................................... H01L 27/88
See application file for complete search history.

(56) References Cited

U.S. PATENT DOCUMENTS

| | | | |
|---|---|---|---|
| 5,827,762 | A | 10/1998 | Bashir et al. |
| 6,627,484 | B1 | 9/2003 | Ang |

(Continued)

OTHER PUBLICATIONS

IBM, Appendix P, List of IBM Patents or Patent Applications Treated as Related, dated Feb. 28, 2017, 2 pages.

*Primary Examiner* — Marvin Payen  
(74) *Attorney, Agent, or Firm* — Shin Hung; VanTek IP LLP

(57) ABSTRACT

Embodiments of the present invention provide methods for fabricating a semiconductor device with buried local interconnects. One method may include providing a semiconductor substrate with fins etched into the semiconductor substrate; forming a first set of spacers along the sides of the fins; depositing a tungsten film over the top surface of the substrate; etching the tungsten film to form a buried local interconnect; forming a set of gates and a second set of spacers; forming a source and drain region adjacent to the fins; depositing a first insulating material over the top surface of the substrate; and creating contact between the set of gates and the source and drain region using an upper buried local interconnect.

10 Claims, 11 Drawing Sheets

(51) Int. Cl.
*H01L 21/8234* (2006.01)
*H01L 23/535* (2006.01)
*H01L 29/06* (2006.01)

(56) References Cited

U.S. PATENT DOCUMENTS

| | | |
|---|---|---|
| 6,664,178 B2 | 12/2003 | Tamaki |
| 6,737,348 B2 | 5/2004 | Satake et al. |
| 6,835,645 B2 | 12/2004 | Ikura |
| 6,917,083 B1 | 7/2005 | Violette et al. |
| 7,084,063 B2 | 8/2006 | Noguchi et al. |
| 7,153,756 B1 | 12/2006 | Houston |
| 8,368,219 B2 | 2/2013 | Halliyal et al. |
| 2007/0161170 A1 | 7/2007 | Orlowski et al. |
| 2008/0296666 A1 | 12/2008 | Iijima |
| 2013/0109152 A1 | 5/2013 | Huang et al. |
| 2013/0187291 A1 | 7/2013 | Kim et al. |
| 2014/0273397 A1 | 9/2014 | Rodder et al. |
| 2016/0148832 A1 | 5/2016 | Leobandung et al. |

SEMICONDUCTOR DEVICE WITH BURIED LOCAL INTERCONNECTS

BACKGROUND OF THE INVENTION

The present invention relates generally to semiconductor devices, and more particularly to a semiconductor device with buried local interconnect wires.

The fabrication of semiconductor devices involves forming electronic components in and on semiconductor substrates, such as silicon wafers. These electronic components may include one or more conductive layers, one or more insulation layers, and doped regions formed by implanting various dopants into portions of a semiconductor substrate to achieve specific electrical properties. Semiconductor devices include transistors, resistors, capacitors, and the like, with intermediate and overlying metallization patterns at varying levels, separated by dielectric materials, which interconnect the semiconductor devices to form integrated circuits.

Local interconnect structures are used to electrically connect the diffusion regions of different transistors fabricated on a common substrate, and to connect diffusion regions to gate layers. Typically, the metal interconnect wiring is built on top the top of a semiconductor chip, while the device portion is on the bottom, under the wiring. As many modern integrated circuits contain millions of individual transistors and other electronic components, power must be supplied to a large number of electrical components fabricated in an integrated circuit. Often, the power is supplied by routing one or more conductive layers throughout the circuit, and making contact through previously deposited layers to the components of the device. This can lead to significant consumption of portions of the semiconductor chip surface that could otherwise be used for active circuit fabrication.

SUMMARY

According to one embodiment of the present invention, a method for fabricating a semiconductor device with buried local interconnects is provided, the method comprising: providing a semiconductor substrate comprising a plurality of fins etched in the semiconductor substrate; forming a first set of spacers along sides of the plurality of fins; depositing a tungsten film over a top surface of the semiconductor substrate; etching the tungsten film to form one or more buried local interconnects; forming a set of gates and a second set of spacers adjacent to the set of gates; forming a source and drain region adjacent to the plurality of fins; depositing a first insulating material over the top surface of the semiconductor substrate; and creating contact between the set of gates and the source and drain region using an upper buried local interconnect.

According to another embodiment of the present invention, a semiconductor structure is provided, the semiconductor structure comprising: a plurality of fins patterned in a starting semiconductor substrate; an insulator and a first set of spacers, wherein the insulator and the first set of spacers are recessed to a same level; a source and drain region formed around the plurality of fins; a gate structure and a second set of spacers, wherein a portion of the gate structure and the second set of spacers are disposed around the plurality of fins; and a buried local interconnect wire, wherein the buried local interconnect wire includes a buried local interconnect and an upper buried local interconnect.

DETAILED DESCRIPTION

Figure 1A:
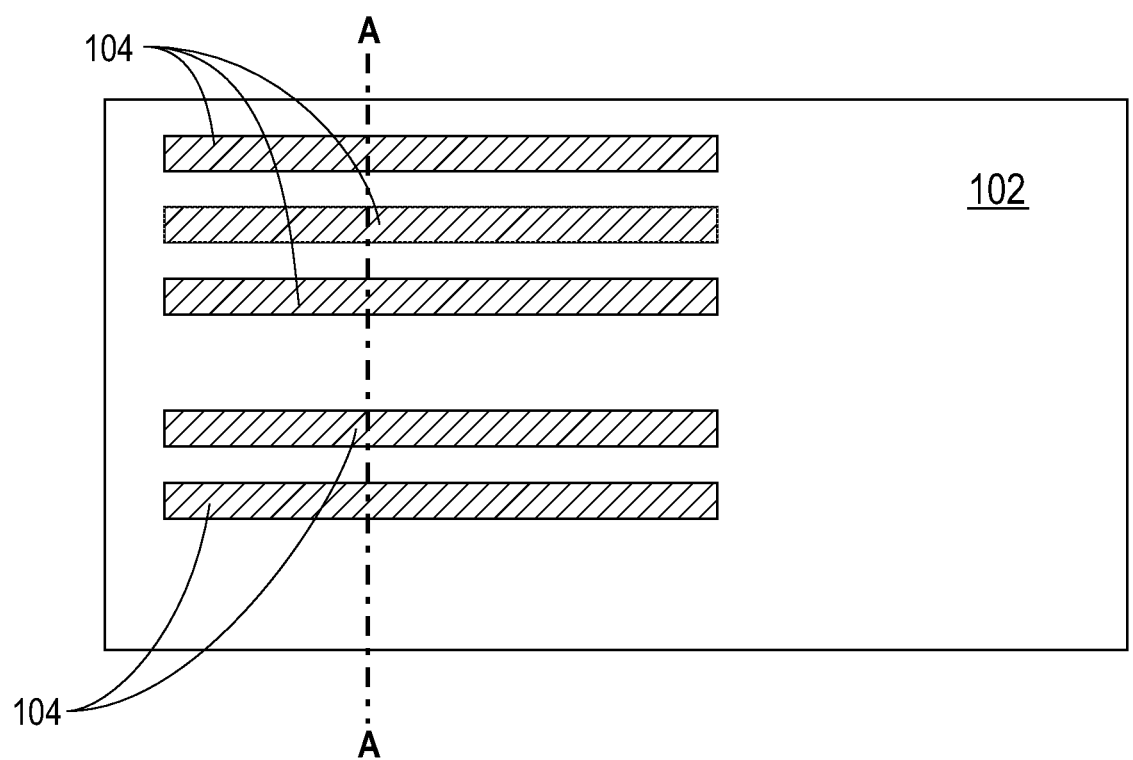
FIGS. 1A and 1B depict a plan view and a cross-sectional view of a starting semiconductor substrate after the patterning of fins, in accordance with an embodiment of the present invention.

Embodiments of the present invention recognize that the formation of metal wiring on a semiconductor device may be difficult as the size of the device decreases and wiring becomes more complex. Embodiments of the present invention provide a fabrication process for a semiconductor device with a buried local interconnect to reduce the congestion of wiring. Detailed description of embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "on", "over", "overlying", "atop", "positioned on", or "positioned atop" mean that a first element, such as a first structure, is present on a second element, such as a second structure, wherein intervening elements, such as an interface structure, may be present between the first element and the second element. The terms "direct contact", "directly on", or "directly over" mean that a first element, such as a first structure, and a second element, such as a second structure, are connected without any intermediary conducting, insulating, or semiconductor layers at the interface of the two elements. The terms "connected" or "coupled" mean that one element is directly connected or coupled to another element, or intervening elements may be present. The terms "directly connected" or "directly coupled" mean that one element is connected or coupled to another element without any intermediary elements present.

Figure 1B:
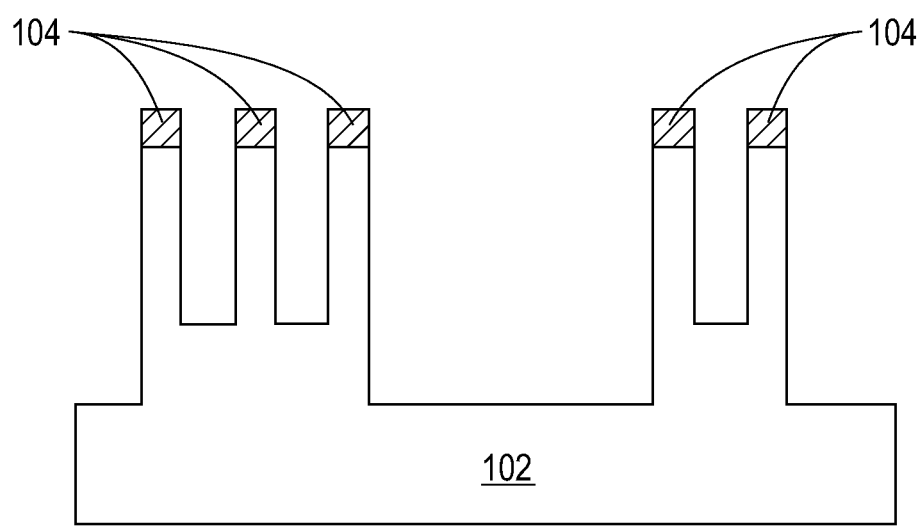

Referring now to the figures, FIG. 1A depicts a plan view of a starting semiconductor substrate after the patterning of fins, in accordance with an embodiment of the present invention, and FIG. 1B depicts a cross-sectional view of FIG. 1A, taken along the line A-A of FIG. 1A. The starting substrate includes base layer(s) 102, and is preferably composed of a silicon containing material. Silicon containing materials include, but are not limited to, Si, single crystal Si, polycrystalline Si, SiGe, single crystal silicon germanium, polycrystalline silicon germanium, or silicon doped with carbon, amorphous Si, and combinations and multi-layers thereof. Base layer(s) 102 may also be composed of other semiconductor materials, such as germanium, and compound semiconductor substrates, such as type III/V semiconductor substrates, e.g., GaAs, InP, or InGaAs. In this exemplary embodiment, a SiN hard mask 104 is deposited over the starting substrate, and fin regions are patterned on the starting substrate. The fins are then formed using a standard etch process, such as reactive ion etching (RIE), etched to a depth of approximately 100 nm. In other embodiments, the starting substrate may be a non-planar semiconductor device or a nanowire semiconductor device.

Figure 2A:
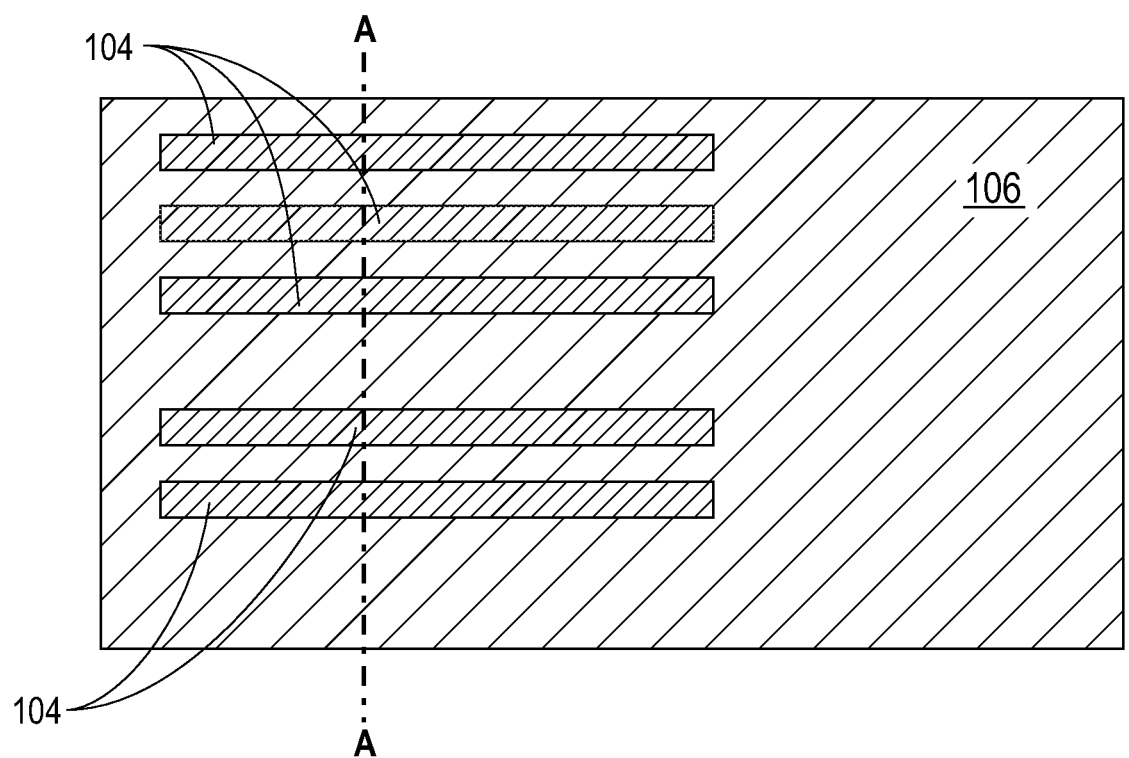
FIGS. 2A and 2B depict a plan view and a cross-sectional view of the semiconductor device after the device regions of FIGS. 1A and 1B are created and filled through shallow trench isolation (STI), in accordance with an embodiment of the present invention.
Figure 2B:
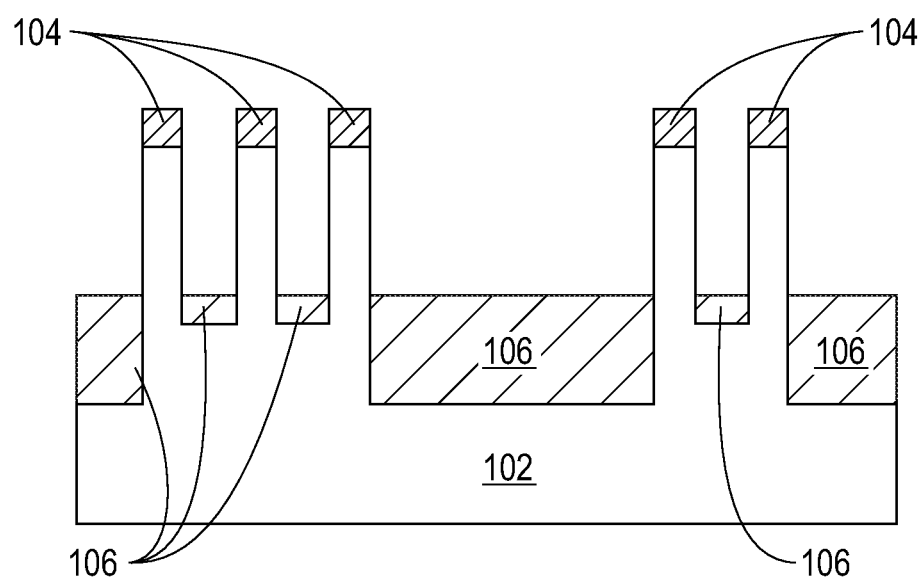

Referring now to FIGS. 2A and 2B, FIG. 2A is a plan view of the semiconductor device after the device regions of FIGS. 1A and 1B are created and filled through shallow trench isolation (STI), in accordance with an embodiment of the present invention, and FIG. 2B is a cross-sectional view of FIG. 2A, taken along the line A-A of FIG. 2A. Subsequent to the formation of the fins (processing step of FIGS. 1A and 1B), device regions are created through shallow trench isolation (STI). In a preferred embodiment, the shallow trenches are filled to a depth of approximately 20 nm to 30 nm with one or more insulating materials 106, such as $SiO_2$, to isolate the fins from each other. This prevents electrical current leakage between adjacent semiconductor device components, preventing one device region from affecting another or shorting out through contact with another. Subsequent to filling the shallow trenches with insulating material 106, insulating material 106 is planarized using a standard planarization method in the art, such as chemical mechanical planarization (CMP) or grinding.

Figure 3A:
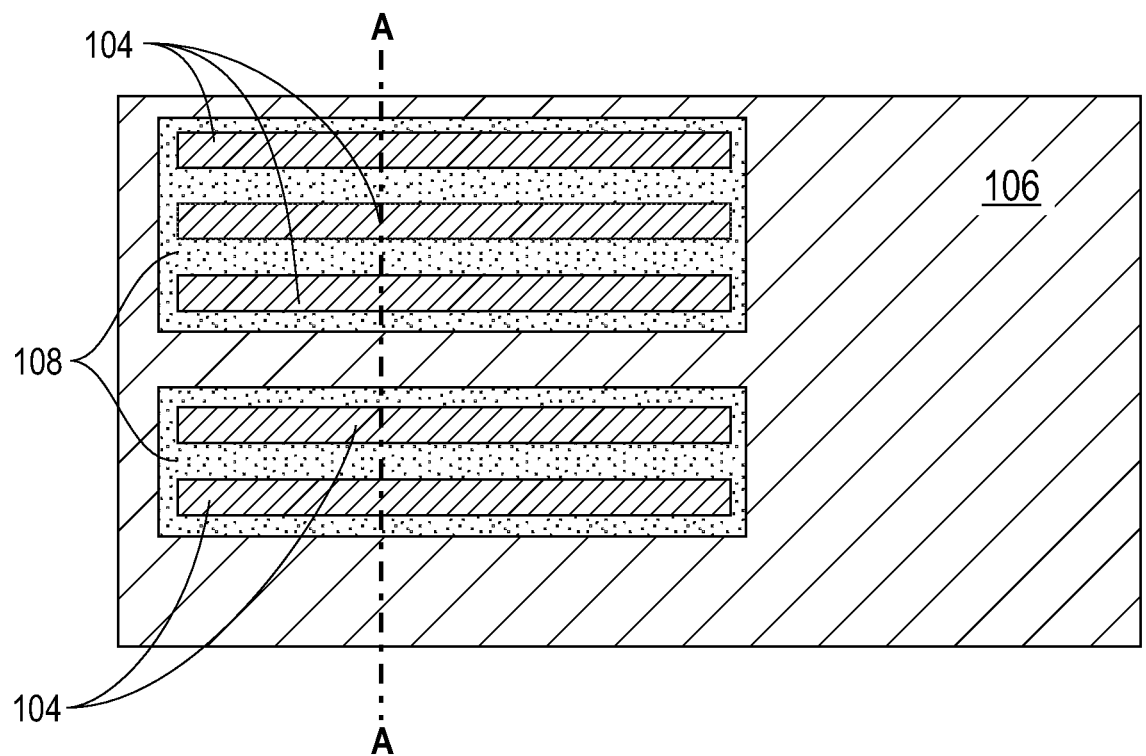
FIGS. 3A and 3B depict a plan view and a cross-sectional view of the semiconductor device after the formation of spacers, in accordance with an embodiment of the present invention.
Figure 3B:
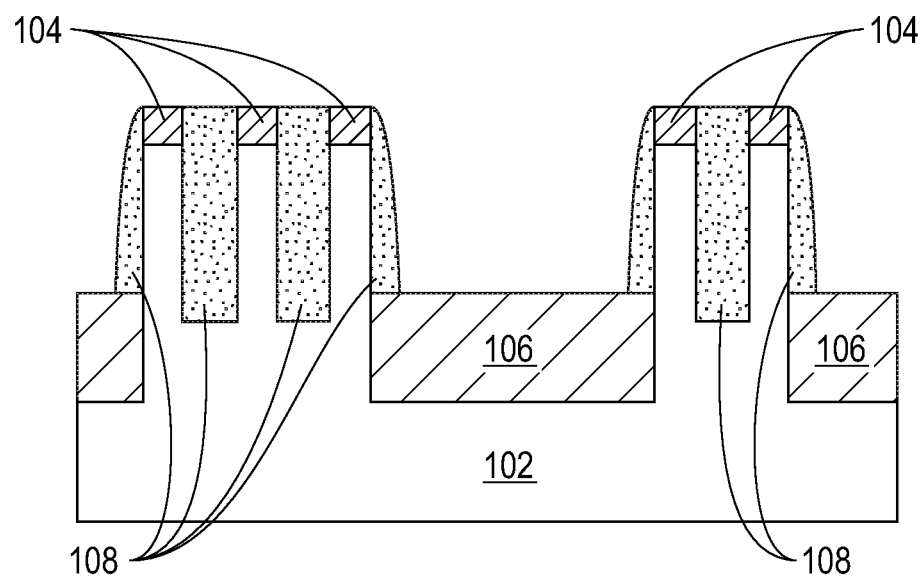

Referring now to FIGS. 3A and 3B, FIG. 3A depicts a plan view of the semiconductor device after the formation of spacers 108, in accordance with an embodiment of the present invention, and FIG. 3B depicts a cross-sectional view of FIG. 3A, taken along the line A-A of FIG. 3A. A set of spacers 108 are formed on the sidewalls of the fin regions. In this exemplary embodiment, spacers 108 have a width of approximately 10 nm. Spacers 108 may be composed of any dielectric material, such as a nitride, oxide, oxynitride, or a combination thereof. In this exemplary embodiment, spacers 108 are composed of an oxide. In other embodiments, spacers 108 may be composed of a silicon nitride ($Si_3N_x$).

Figure 4A:
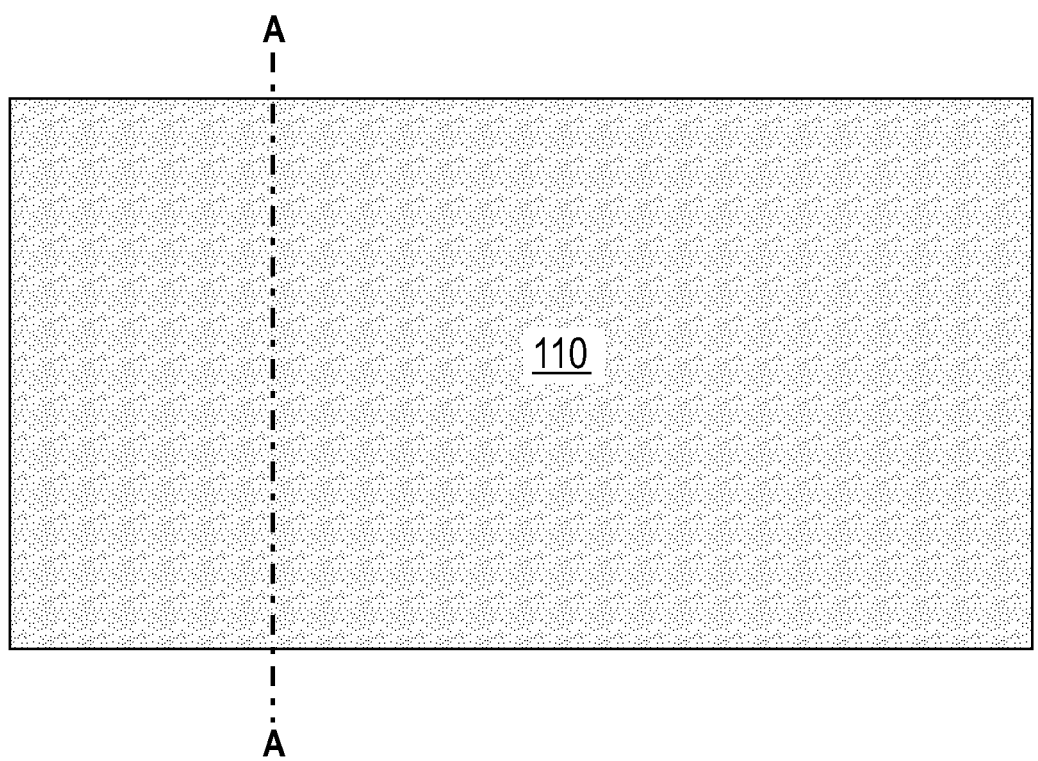
FIGS. 4A and 4B depict a plan view and a cross-sectional view of the semiconductor device after the deposition of a tungsten film over the device regions, in accordance with an embodiment of the present invention.
Figure 4B:
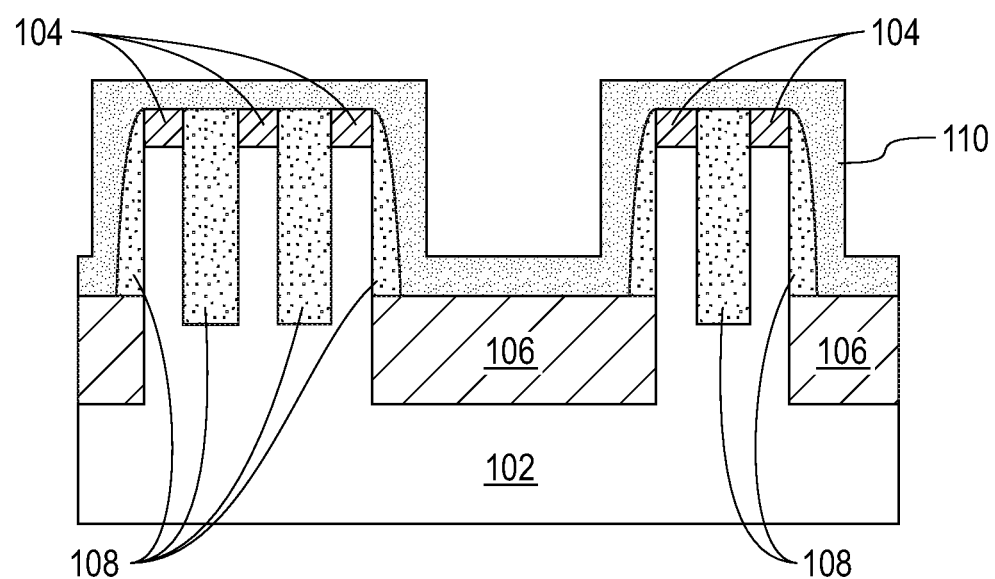

Referring now to FIGS. 4A and 4B, FIG. 4A depicts a plan view of the semiconductor device after the deposition of tungsten (W) 110 film over the device regions, in accordance with an embodiment of the present invention, and FIG. 4B depicts a cross-sectional view of FIG. 4A, taken along the line A-A of FIG. 4A. In this exemplary embodiment, tungsten 110 with a thickness of, for example, 30 nm is deposited over the upper surface of spacers 108 using chemical vapor deposition (CVD). The deposited tungsten 110 acts like a buried local interconnect, and connects devices locally to reduce the congestion in the wiring.

Figure 5A:
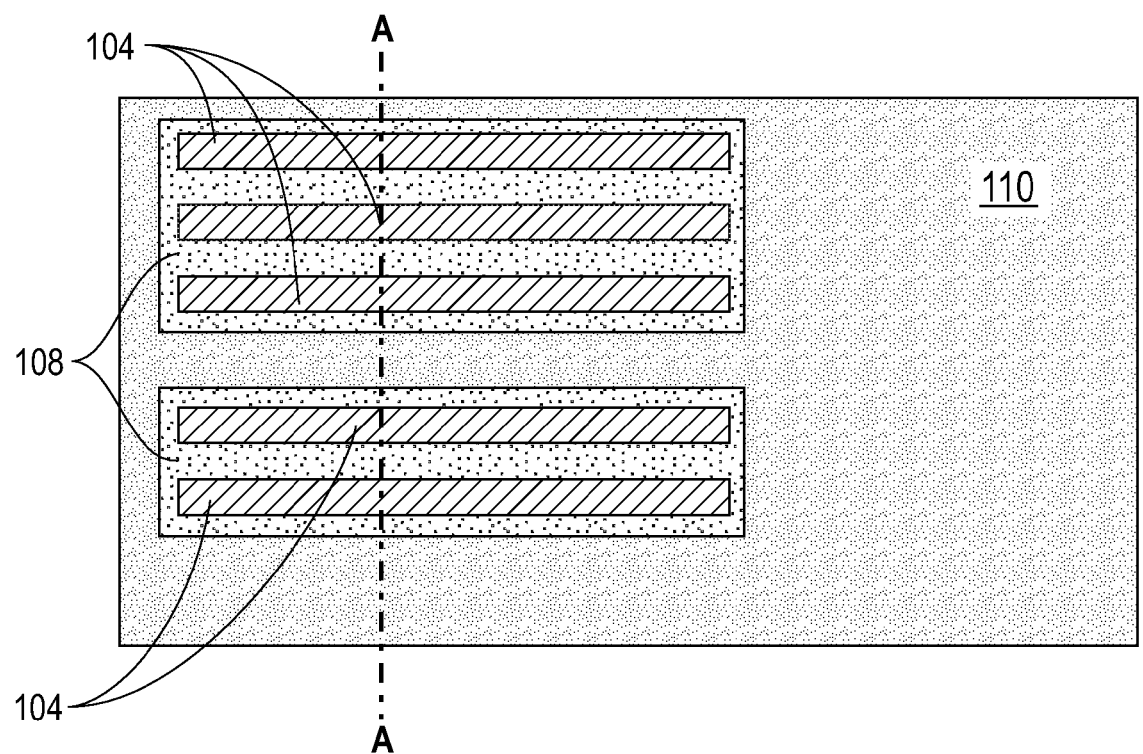
FIGS. 5A and 5B depict a plan view and a cross-sectional view of the semiconductor device after the planarization of the tungsten film of FIGS. 4A and 4B, in accordance with an embodiment of the present invention.
Figure 5B:
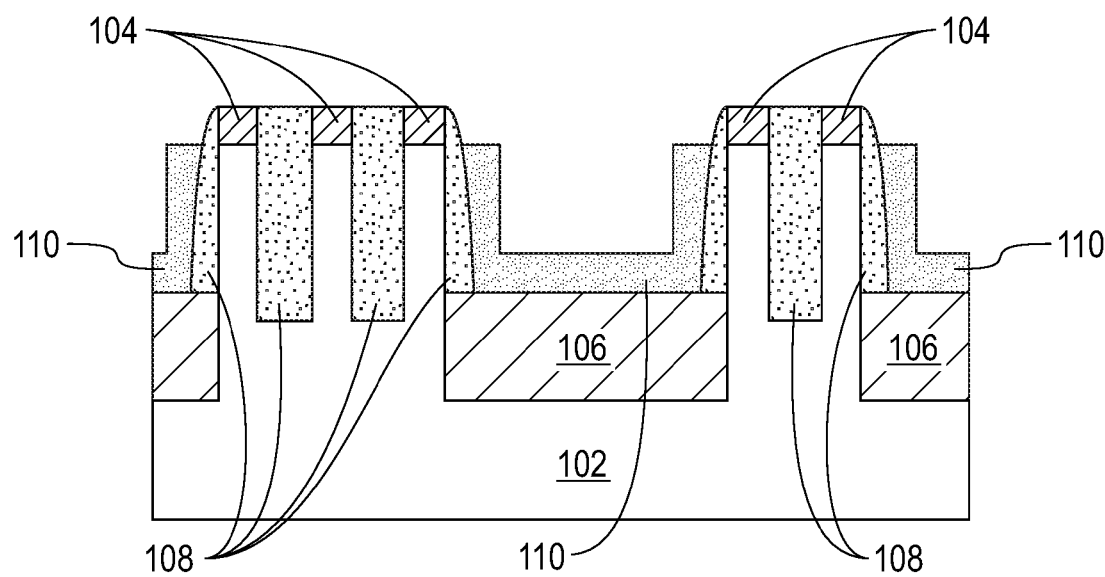

Referring now to FIGS. 5A and 5B, FIG. 5A depicts a plan view of the semiconductor device after the planarization of the top layer of tungsten 110 of FIGS. 4A and 4B, in accordance with an embodiment of the present invention, and FIG. 5B depicts a cross-sectional view of FIG. 5A, taken along the line A-A of FIG. 5A. In this exemplary embodiment, planarization is selectively used to remove only the top layer of tungsten 110, avoiding removal of the sides and bottom of tungsten 110, so that hard mask 104 and the upper surface of spacers 108 are exposed, as depicted in FIG. 5A. In one embodiment, the planarization process includes chemical mechanical polishing (CMP) or grinding. CMP is a material removal process using both chemical reactions and mechanical forces to remove material and planarize a surface. In other embodiments, planarization processes known in the art, such as organic dielectric layer (ODL) spin or a combination of CMP/reactive ion etching (RIE), may be implemented.

Figure 6A:
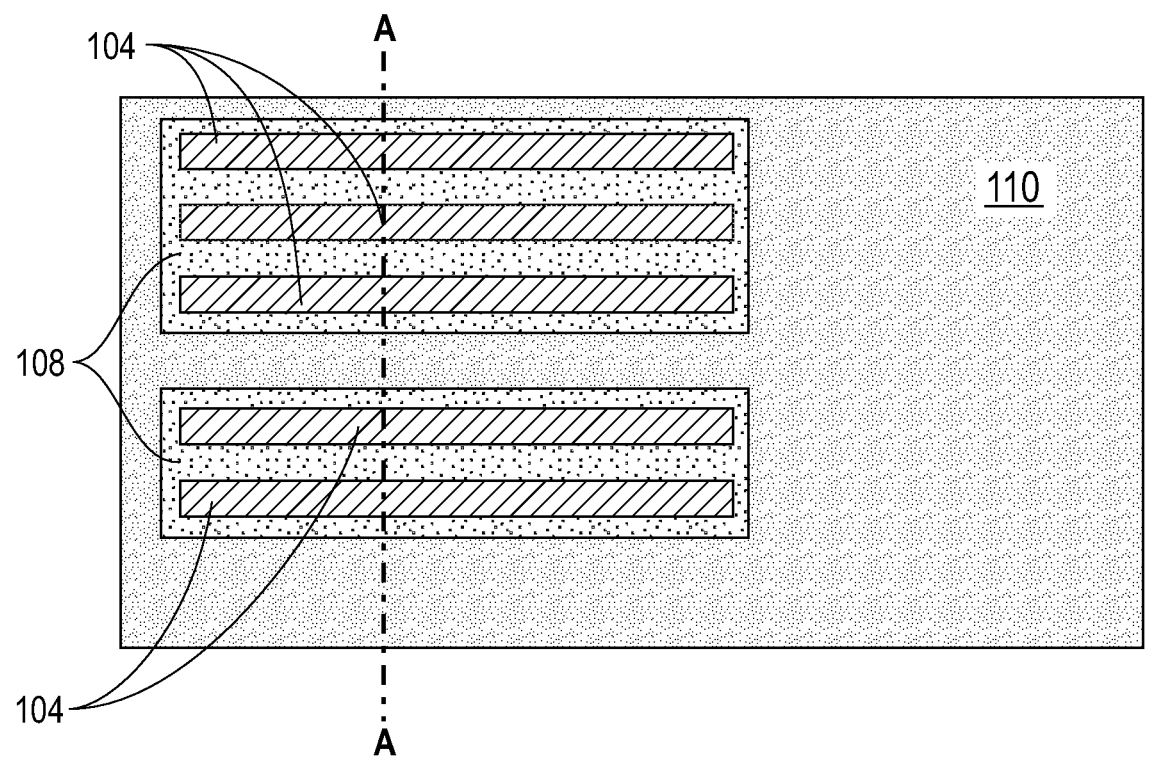
FIGS. 6A and 6B depict a plan view and a cross-sectional view of the semiconductor device after the recess of the spacers from the fin area, in accordance with an embodiment of the present invention.
Figure 6B:
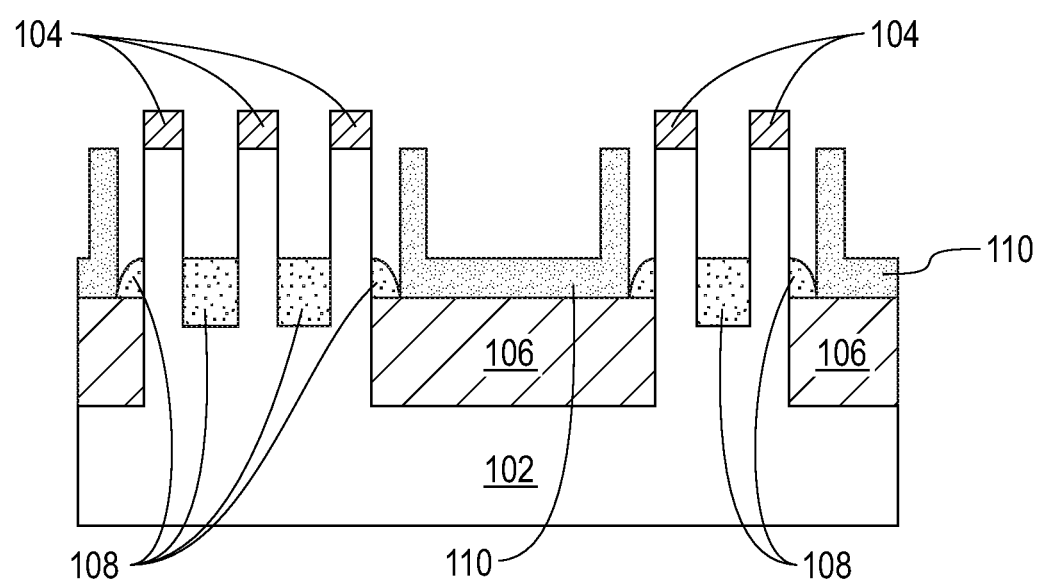

Referring now to FIGS. 6A and 6B, FIG. 6A depicts a plan view of the semiconductor device after the recess of spacers 108 from the fin area, in accordance with an embodiment of the present invention, and FIG. 6B depicts a cross-sectional view of FIG. 6A, taken along the line A-A of FIG. 6A. In this exemplary embodiment, a standard etching process is used to recess spacers 108 from the fin area, such as RIE. The oxide spacers 108 are recessed (etched) down to the same level as the STI insulator fill level of FIGS. 2A and 2B (i.e., approximately 20 nm to 30 nm).

Figure 7A:
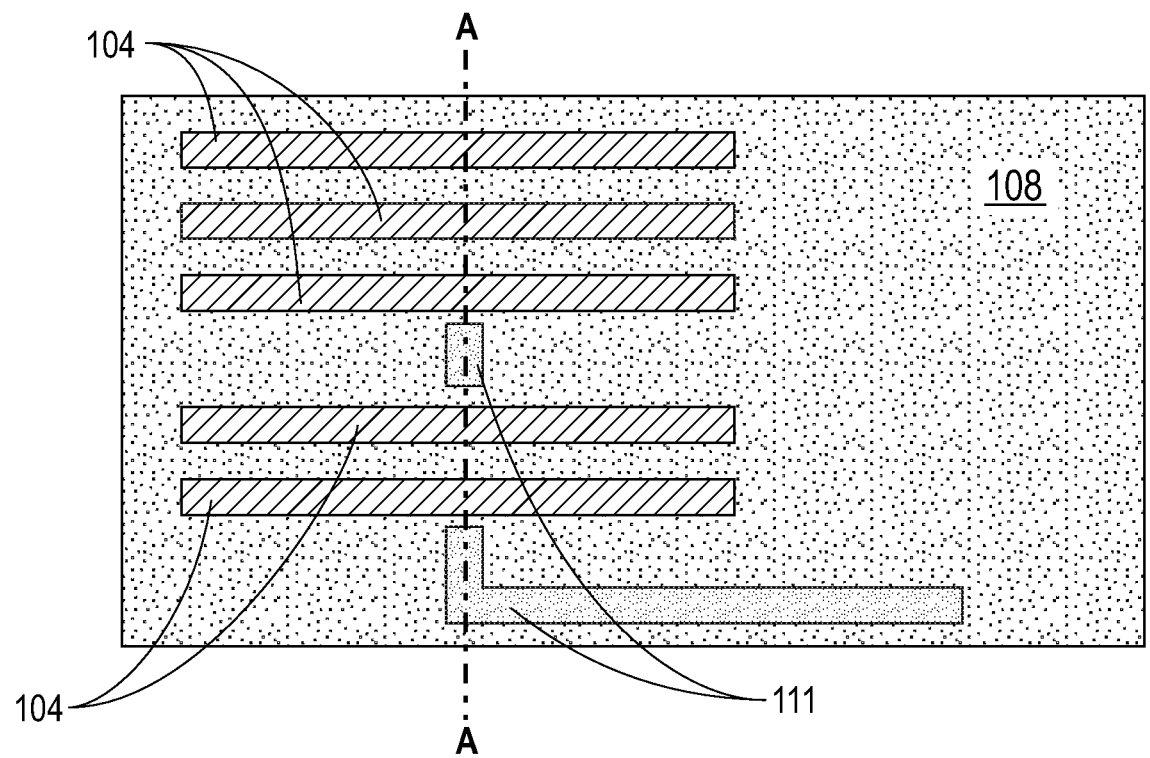
FIGS. 7A and 7B depict a plan view and a cross-sectional view of the semiconductor device after the patterning of the buried local interconnects, in accordance with an embodiment of the present invention.
Figure 7B:
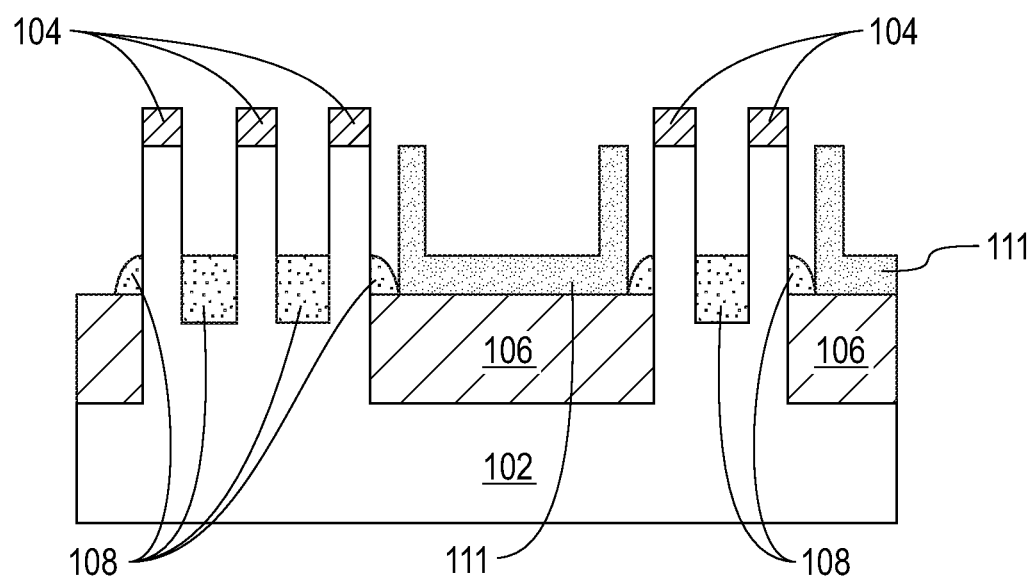

Referring now to FIGS. 7A and 7B, FIG. 7A depicts a plan view of the semiconductor device after the patterning of buried local interconnects 111, in accordance with an embodiment of the present invention, and FIG. 7B depicts a cross-sectional view of FIG. 7A, taken along the line A-A of FIG. 7A. In this exemplary embodiment, buried local interconnects 111 are patterned using standard lithography and etching techniques known in the art. Tungsten 110 (FIGS. 6A and 6B) is patterned such that the portion of tungsten 110 which remains after the patterning forms buried local interconnects 111.

Figure 8A:
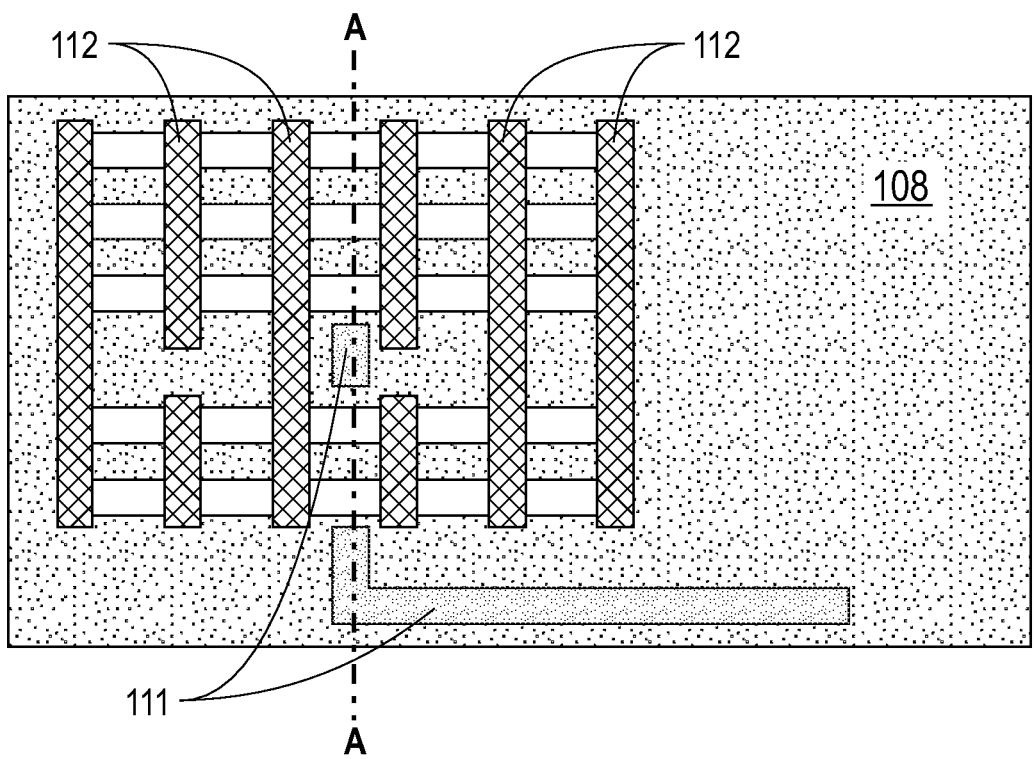
FIGS. 8A and 8B depict a plan view and a cross-sectional view of the semiconductor device after the deposition of a dummy gate, in accordance with an embodiment of the present invention.
Figure 8B:
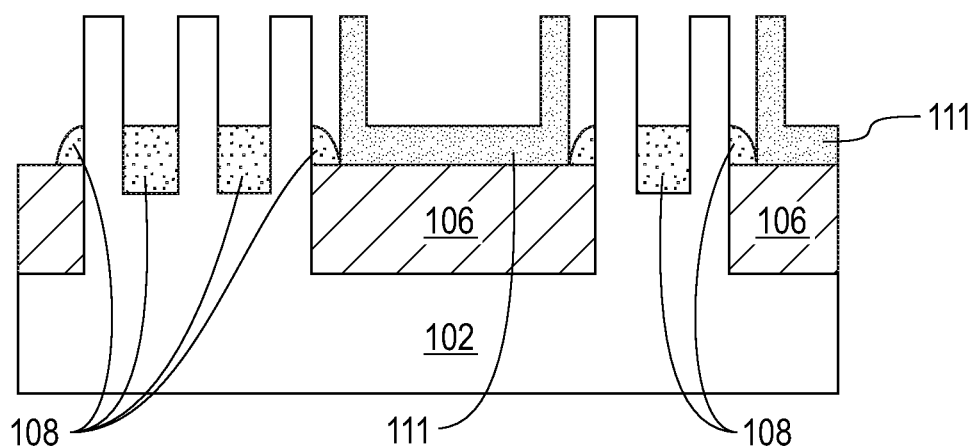

Referring now to FIGS. 8A and 8B, FIG. 8A depicts a plan view of the semiconductor device after the deposition of dummy gates 112 in the fin regions of the semiconductor device, in accordance with an embodiment of the present invention, and FIG. 8B depicts a cross-sectional view of FIG. 8A, taken along the line A-A of FIG. 8A. Dummy gates 112 (sacrificial gate structures) are formed and, after formation of source and drain regions 114 (depicted in FIGS. 9A and 9B), may be selectively etched and replaced. One exemplary process for forming dummy gates 112 comprises depositing a dielectric layer over the starting substrate and a polysilicon layer over the dielectric layer. A lithography and gate etch process removes unnecessary portions of the stacked layers to leave dummy gates 112, comprised of a gate oxide (not pictured) and a polysilicon layer (not pictured). Ultimately, dummy gates 112 may be comprised of any material that can be etched selectively to the underlying upper semiconductor layer, for example, an oxide or polysilicon.

Figure 9A:
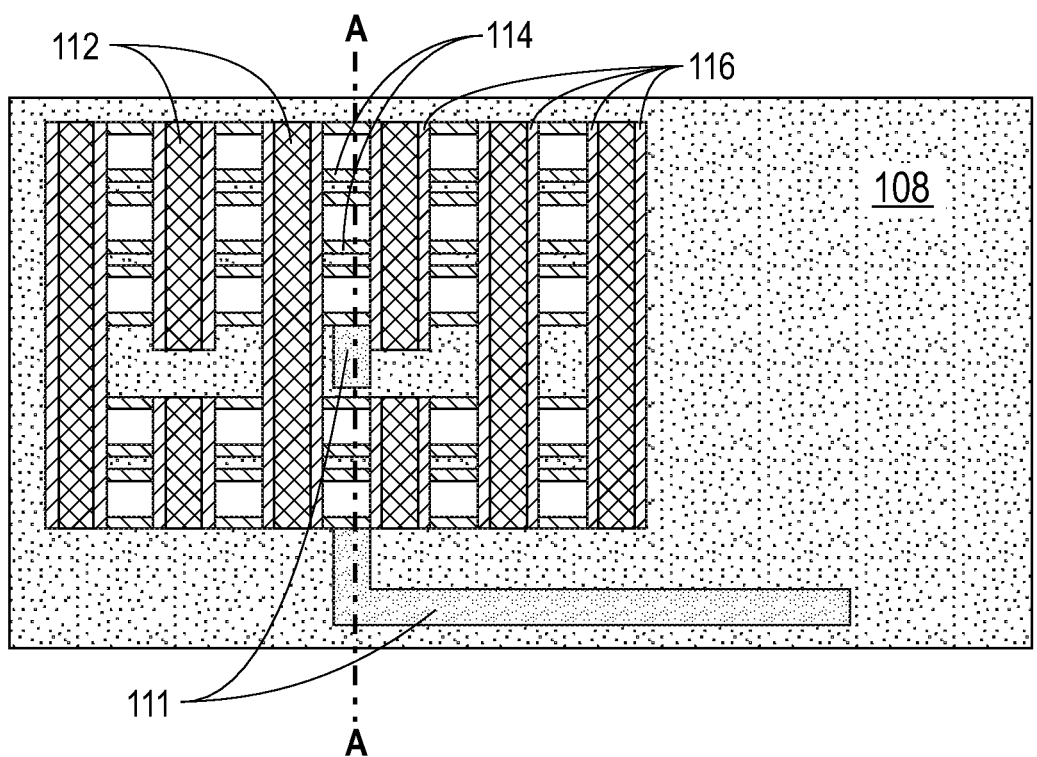
FIGS. 9A and 9B depict a plan view and a cross-sectional view of the semiconductor device after the formation of spacers and a source and drain region, in accordance with an embodiment of the present invention.
Figure 9B:
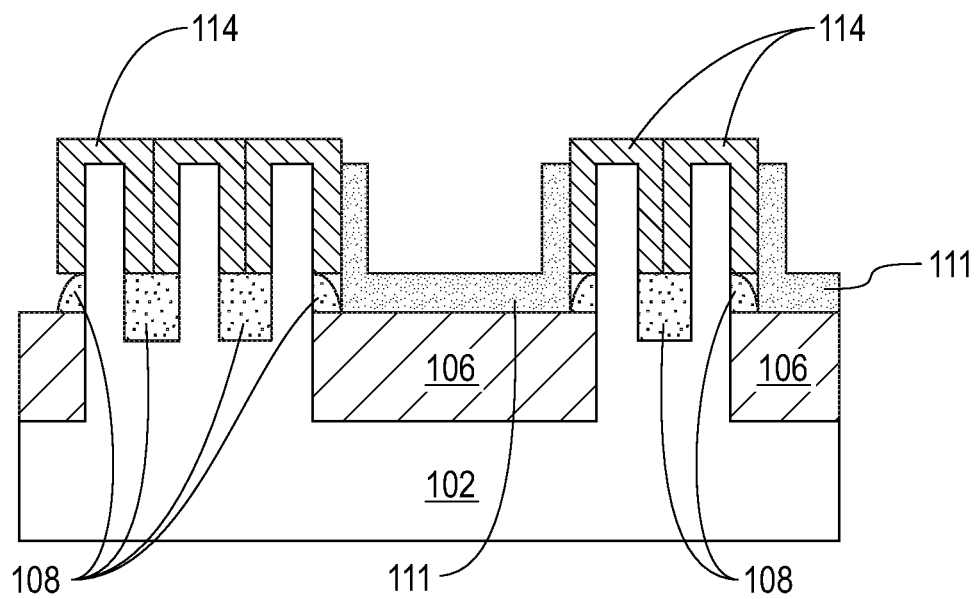

Referring now to FIGS. 9A and 9B, FIG. 9A depicts a plan view of the semiconductor device after the formation of spacers 116 and source and drain regions 114, in accordance with an embodiment of the present invention, and FIG. 9B depicts a cross-sectional view of FIG. 9A, taken along the line A-A of FIG. 9A. Spacers 116 are formed adjacent to dummy gates 112, i.e., in direct contact with the sidewall of dummy gates 112. A spacer typically has a width ranging from 2.0 nm to 15.0 nm, as measured from the sidewall of a gate structure. Spacers 116 may be composed of any dielectric material, such as a nitride, oxide, oxynitride, or a combination thereof. Those skilled in the art will recognize that a "set" of sidewall spacers may actually comprise a single spacer formed around the entire gate. The formation of source and drain regions 114 includes a number of high-temperature steps (e.g., implants, doped epitaxy growth, and anneals). In this exemplary embodiment, source and drain regions 114 are formed using epitaxy. In one embodiment, source and drain regions 114 are formed using an ion implantation process.

Figure 10A:
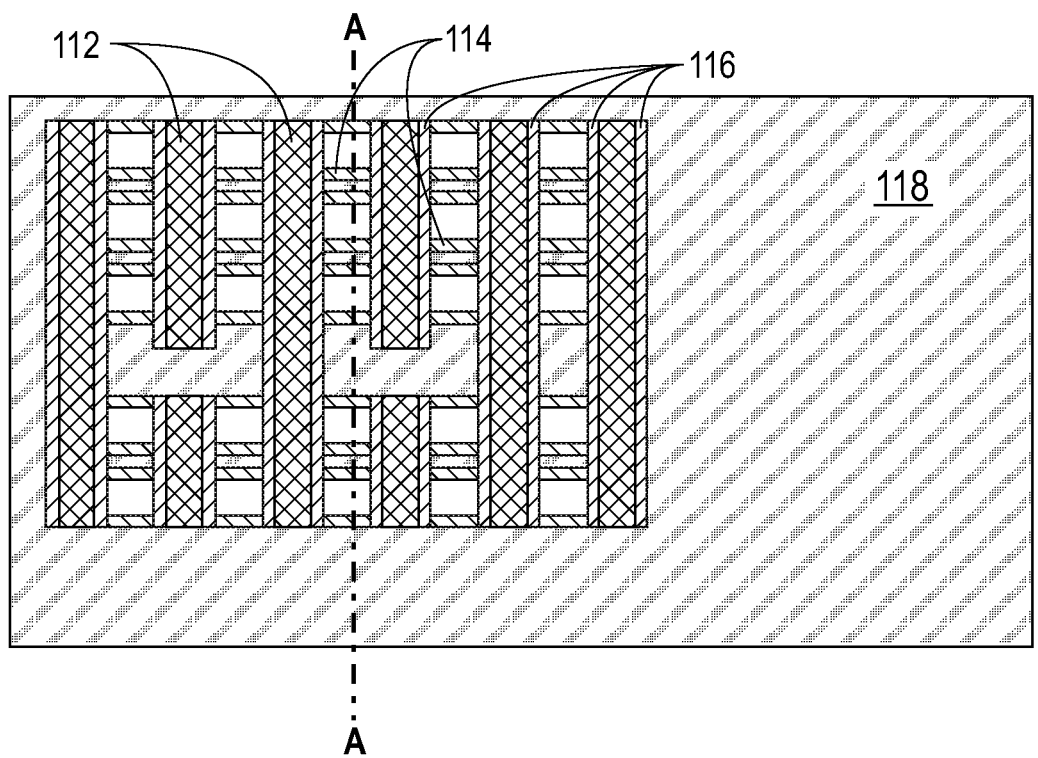
FIGS. 10A and 10B depict a plan view and a cross-sectional view of the semiconductor device after the deposition of an insulator and the planarization of the semiconductor device of FIGS. 9A and 9B, in accordance with an embodiment of the present invention.
Figure 10B:
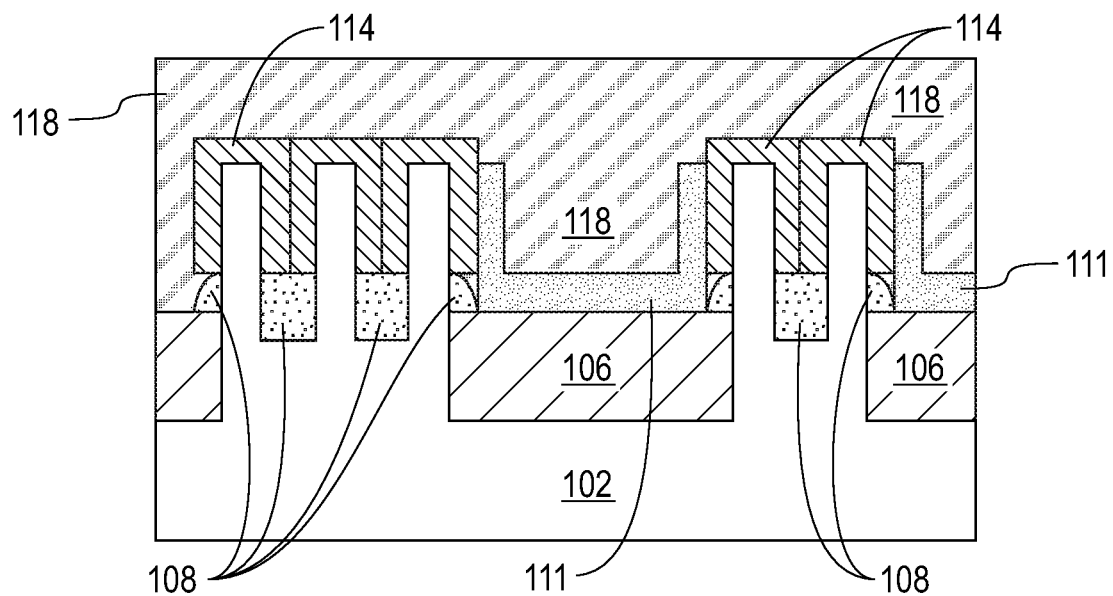

Referring now to FIGS. 10A and 10B, FIG. 10A depicts a plan view of the semiconductor device after the deposition of insulator 118 and the planarization of the semiconductor device of FIGS. 9A and 9B, in accordance with an embodiment of the present invention, and FIG. 10B depicts a cross-sectional view of FIG. 10A, taken along the line A-A of FIG. 10A. Insulator 118 is first deposited over the device regions. Insulator 118 may consist of silicon oxide, silicon nitride, or any other dielectric material. Insulator 118 may be deposited using, for example, chemical vapor deposition (CVD), or any variation of CVD processes including, but not limited to, atmospheric pressure CVD (APCVD), low pressure CVD (LPCVD), plasma enhanced CVD (PECVD). Other deposition techniques may also be used. Following deposition of insulator 118, insulator 118 is planarized using a standard planarization method in the art, until the upper surfaces of dummy gates 112 are exposed. In one embodiment, the planarization process includes chemical mechanical polishing (CMP) or grinding. After the planarization, dummy gates 112 may be replaced with an actual gate. The actual gate may consist of one or more layers of a gate dielectric, such as HfO or ZrO, followed by a metal, such as TiN, TaN, W, etc. In other embodiments, dummy gates 112 (hereafter referred to as gates 112) may be an actual gate, and are not subsequently replaced with a replacement gate.

Figure 11A:
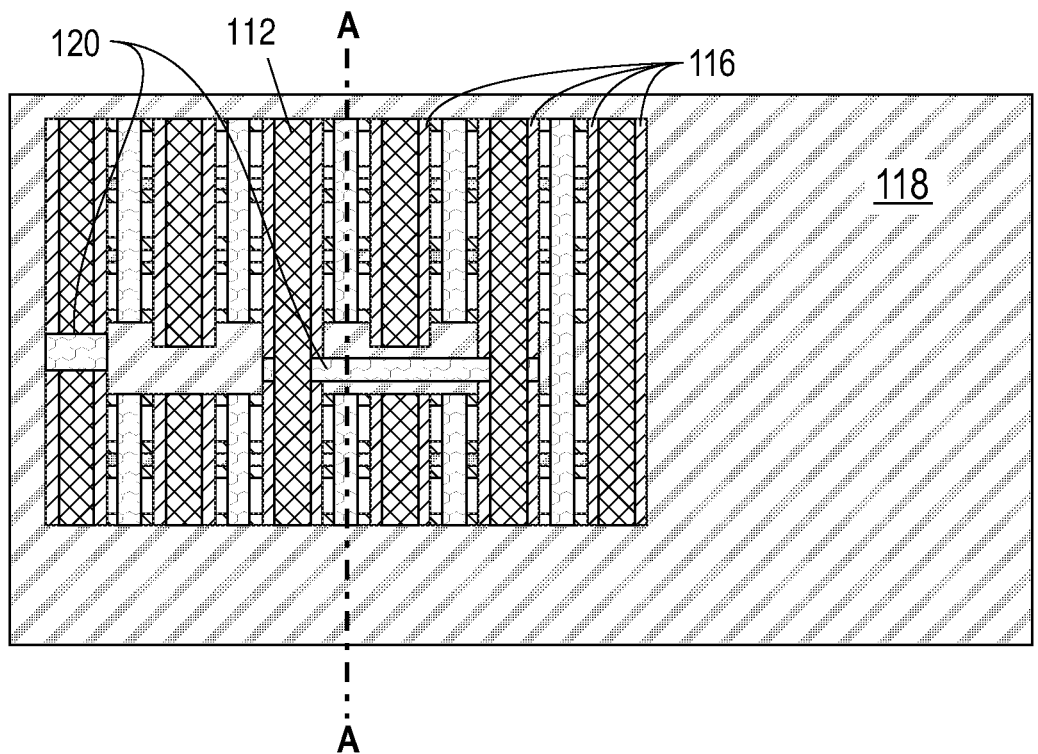
FIGS. 11A and 11B depict a plan view and a cross-sectional view of the semiconductor device after the formation of contact to the gate and source and drain regions, in accordance with an embodiment of the present invention.
Figure 11B:
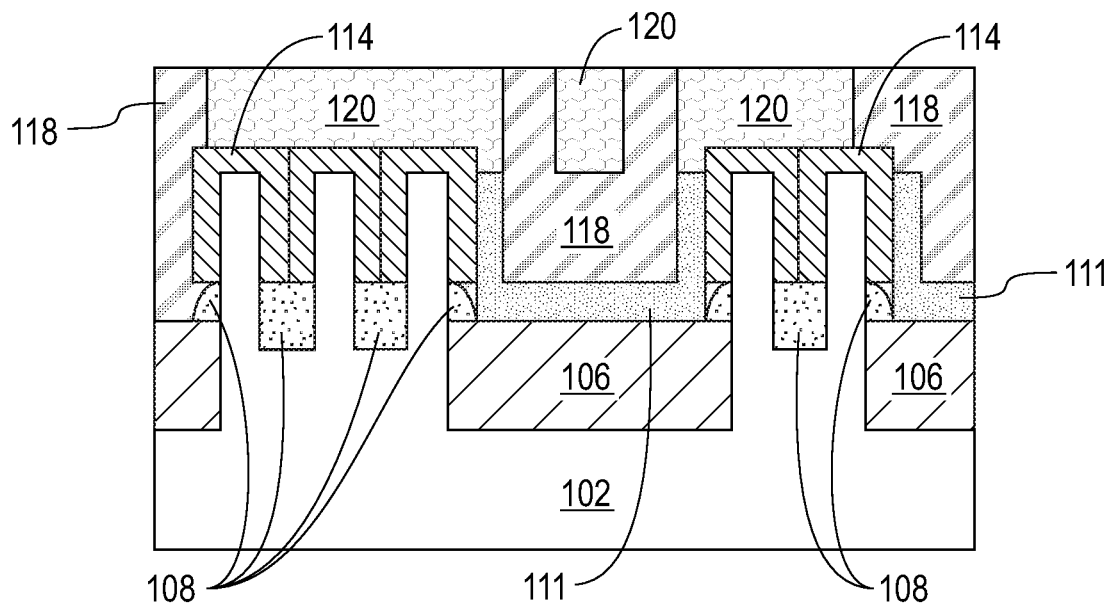

Referring now to FIGS. 11A and 11B, FIG. 11A depicts a plan view of the semiconductor device after the formation of contact to gates 112 and source and drain regions 114 by upper local interconnect 120, in accordance with an embodiment of the present invention, and FIG. 11B depicts a cross-sectional view of FIG. 11A, taken along the line A-A of FIG. 11A. Standard middle of the line and back end of the line (BEOL) processes known in the art may be performed to complete the semiconductor chip (not depicted). After completion of the processing, upper local interconnect 120 provides an electrical connection between the device source and drain regions 114 and gates 112, or with buried local interconnects 111, or with other devices.

Having described the preferred embodiments of a method for forming a buried local interconnect (which are intended to be illustrative and not limiting), it is noted that modifications and variations may be made by persons skilled in the art in light of the above teachings. It is, therefore, to be understood that changes may be made in the particular embodiments disclosed which are within the scope of the invention, as outlined by the appended claims.

In certain embodiments, the fabrication steps depicted above may be included on a semiconductor substrate consisting of many devices and one or more wiring levels to form an integrated circuit chip. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications, to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

What is claimed is:
1. A semiconductor structure comprising:
a plurality of fins patterned in a starting semiconductor substrate;
an insulator and a first set of spacers, wherein the insulator and the first set of spacers are recessed to a same level;
a source and drain region formed around the plurality of fins;
a gate structure and a second set of spacers, wherein a portion of the gate structure and the second set of spacers are disposed around the plurality of fins; and a buried local interconnect wire, wherein the buried local interconnect wire includes a buried local interconnect and an upper buried local interconnect.

2. The semiconductor structure of claim 1, wherein the upper buried local interconnect is configured to provide an electrical connection between the gate structure and the source and drain region.

3. The semiconductor structure of claim 1, wherein the upper buried local interconnect is configured to provide an electrical connection between the source and drain region and the buried local interconnect.

4. The semiconductor structure of claim 1, wherein the starting semiconductor substrate comprises one or more of: Si, single crystal Si, polycrystalline Si, SiGe, single crystal silicon germanium, polycrystalline silicon germanium, silicon doped with carbon, amorphous Si, semiconductor materials, and compound semiconductor substrates.

5. The semiconductor structure of claim 1, wherein the plurality of fins are etched to a depth of 100 nm.

6. The semiconductor structure of claim 1, wherein the buried local interconnect comprises tungsten.

7. The semiconductor structure of claim 1, wherein the insulator comprises a silicon oxide or a silicon nitride.

8. The semiconductor structure of claim 1, wherein the gate structure comprises at least one layer of a gate dielectric and at least one metal.

9. The semiconductor structure of claim 1, wherein the insulator and the first set of spacers are recessed to a level of greater than or equal to 20 nm and less than or equal to 30 nm.

10. The semiconductor structure of claim 1, wherein the gate structure comprises a dummy gate or an actual gate.

* * * * *